United States Patent [19]

Phillips et al.

[11] Patent Number: 5,534,860
[45] Date of Patent: Jul. 9, 1996

[54] MULTIPLE KEY ARRAY

[76] Inventors: Joseph E. Phillips, 11709A Davey Dr., Huntley, Ill. 60142; John J. Oskorep, 9132 Stratford La., Palos Hills, Ill. 60465; Steven S. Lee, 4214 Devonshire Ct., Northbrook, Ill. 60062

[21] Appl. No.: 236,797

[22] Filed: May 2, 1994

[51] Int. Cl.[6] .................................................. H03M 11/20
[52] U.S. Cl. .............................................. 341/22; 341/26
[58] Field of Search ...................... 341/22, 26; 178/17 C; 345/168, 174

[56] References Cited

U.S. PATENT DOCUMENTS

| | | |
|---|---|---|
| 4,222,038 | 9/1980 | Magerl . |
| 4,616,213 | 10/1986 | Danish ........................................ 341/26 |
| 5,057,836 | 10/1991 | Inaba ........................................... 341/26 |
| 5,265,274 | 11/1993 | Knutson et al. . |

Primary Examiner—John K. Peng
Assistant Examiner—Andrew Hill
Attorney, Agent, or Firm—Susan L. Lukasik

[57] ABSTRACT

An apparatus for and method of scanning a key array (101–116) uses two or three scan lines (134 and 135 or 308, 309, and 310), thereby limiting the need for an excessive number of input/output lines of a processor (136). A separate resistor ladder (301,302, 303) is provided for each dimension of keys, including row, column, and/or matrix. A minimal number of parts is also required to implement the resistor ladder (301,302, 303). A reference conductor (311), a row conductor (312), a column conductor (313), and, if desired, a matrix conductor (314) each run under each key, such that when a different key is depressed, a unique combination of voltages appears at the scan lines (134 and 135 or 308, 309, and 310) for the resistor ladders (301, 302, 303).

20 Claims, 2 Drawing Sheets

MULTIPLE KEY ARRAY

FIELD OF THE INVENTION

This invention relates to key entry, including but not limited to multiple key entry via electrical input.

BACKGROUND OF THE INVENTION

Keyboards having a matrix of keys are particularly well suited for use in data processing systems and other devices, including computers and communication units, such as two-way radios. The individual keys of such keyboards provide continuity between corresponding column and row conductors when depressed. Output signals from the data processing system are coupled to each column conductor for sequentially scanning the keyboard for depressed keys. A depressed key is sensed when the output signal from the column conductor is present on the corresponding row conductor. Thus, for an array of keys having K rows and J columns, the data processing system must provide J output signals for the J columns and monitor the K row conductors. As a result, a relatively large number of signals (K+J) are required to interface the data processing system to the keyboard.

In order to reduce the number of interconnecting signals, additional circuitry may be utilized for scanning the array of keys and providing a digitally coded signal when a particular key is depressed. The digitally coded signal uniquely identifies the depressed key. Nevertheless, the stored program control of the data processing system must be programmed to decode the digitally coded signals in order to recognize the depressed key, and the additional circuitry increases the cost of the data processing system.

Because microprocessors are in general used to scan keys, the input lines must be connected to the microprocessor, thereby using K+J input lines of a microprocessor. Because microprocessors today perform more and more functions for a particular device, such as a radio, each input line and output line of the microprocessor becomes increasingly valuable. Consequently, if a simple keyboard utilizes 16 keys, in a 4×4 array, eight inputs are required from a microprocessor. This use of microprocessor inputs is inefficient and a wasteful.

Accordingly, there is a need for an apparatus and method of scanning a large number of keys such that a minimal number of inputs is needed to scan the keys.

DESCRIPTION OF A PREFERRED EMBODIMENT

Figure 1:
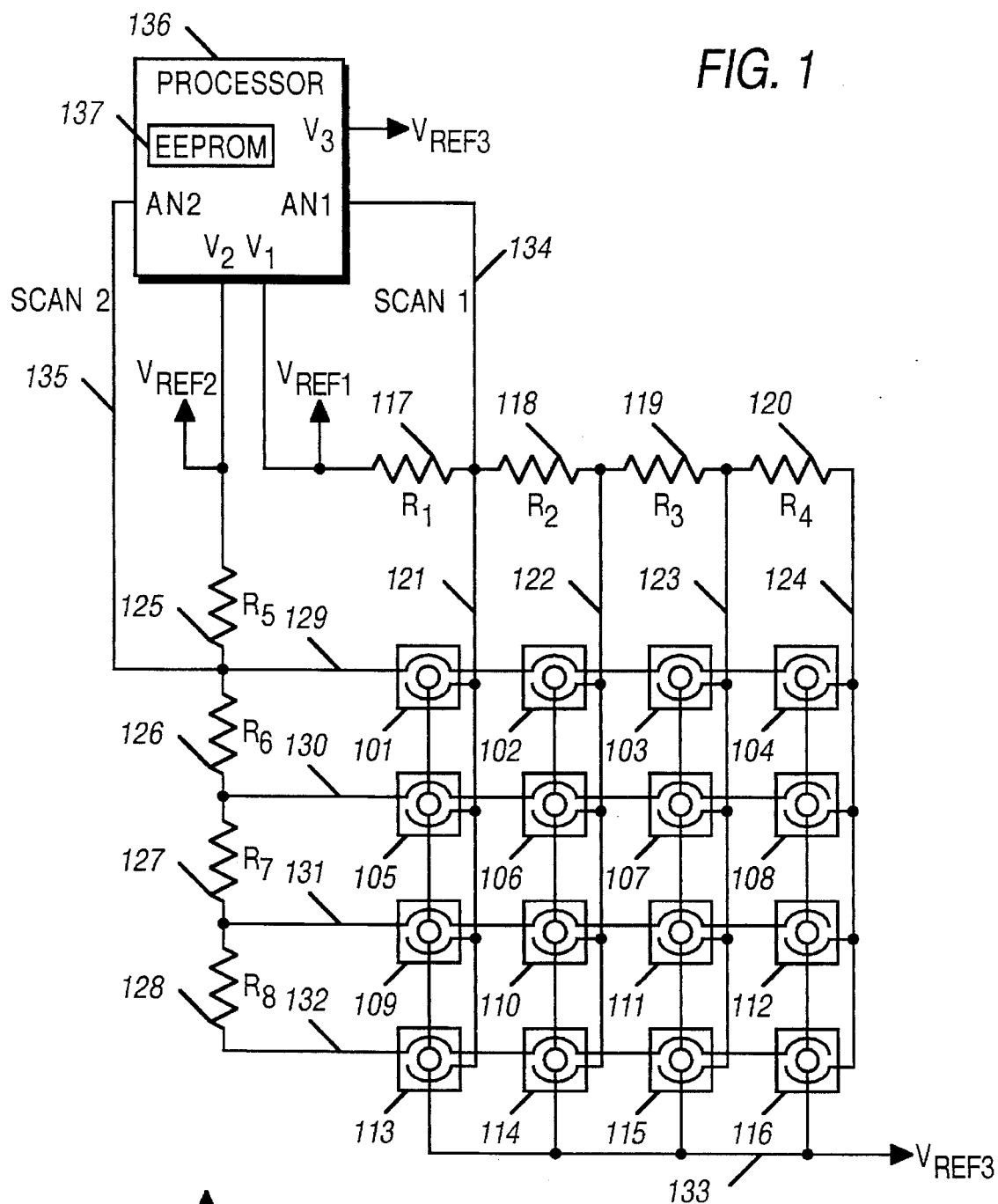
FIG. 1 is a diagram of a key array in accordance with the invention.

The following describes an apparatus for and method of scanning a key array with a minimal number of scan lines, thereby limiting the need for an excessive number of input/output lines of a processor. A separate resistor ladder is provided for each dimension of keys, including row, column, and/or matrix. A minimal number of parts is also required to implement the resistor ladder. A reference conductor, a row conductor, a column conductor, and, if desired, a matrix conductor each run under each key, such that when a different key is depressed, a unique combination of voltages appears at the scan lines for the resistor ladders.

The present invention comprises a multiple key array, in which a plurality of keys organized into K rows and J columns, where K and J are integer numbers greater than one. A first resistor ladder is comprised of K resistors connected in series with a row node between each resistor, yielding K-1 row nodes, and a first voltage reference connected to a first end of the first resistor ladder and a Kth row node at a second end of the first resistor ladder. One of K row conductors is coupled to each of the K row nodes. A second resistor ladder is comprised of J resistors connected in series with a column node between each resistor, yielding J-1 column nodes, and a second voltage reference connected to a first end of the second resistor ladder and a Jth column node at a second end of the second resistor ladder. One of J column conductors is coupled to each of the J column nodes. A reference voltage conductor is coupled to a third reference voltage. A contact is supplied for each of the plurality of keys, such that when a key is depressed, electrical Continuity is provided between the reference voltage conductor, one of the K row conductors, and one of the J column conductors.

The multiple key array further comprises a first scanning line coupled to a first row node, wherein the first row node is connected to a first row resistor of the K resistors, and wherein the first end of the first row resistor is a first end of the first resistor ladder and a second end of the first row resistor is connected to the first row node; and a second scanning line coupled to a first column node, wherein the first column node is connected to a first column resistor of the J resistors, and wherein a first end of the first column resistor is the first end of the second resistor ladder and a second end of the first column resistor is connected to the first column node. In addition, the first scanning line may be coupled to a first analog processor input and the second scanning line may be coupled to a second analog processor input, such that a processor detects when one of the plurality of keys is depressed. In the preferred embodiment, the first reference voltage is the same as the second reference voltage, and the third reference voltage is at ground potential.

A method of reading an array of keys organized into a plurality of rows and columns comprises the steps of reading a first analog row voltage. A first row number is determined from the first analog row voltage. A first analog column voltage is read. A first column number is determined from the first analog column voltage. After waiting for a first sample period to end, a second analog row voltage is read. A second row number is determined from the second analog row voltage. A second analog column voltage is read. A second column number is determined from the second analog column voltage. When the first row number and the second row number match, and the first column number and the second column number match, it is determined which key corresponds to the first row number and the first column number, and that key is processed as entered. When the first row number and the second row number do not match, or the first column number and the second column number do not match, the voltage readings are ignored. Additionally, a key is recognized as released when the first analog row voltage, the first analog column voltage, the second analog row voltage, and the second analog column voltage are within a range of a reference voltage. The row voltages and column voltages may be looked up in a table stored in non-volatile memory.

In an alternative embodiment, the present invention comprises a multiple key array, in which a plurality of keys is organized into K rows, J columns, and L matrices, where K, J, and L are integer numbers greater than one. A first resistor ladder is comprised of K resistors connected in series with a row node between each resistor, yielding K-1 row nodes, and a first voltage reference connected to a first end of the first resistor ladder and a Kth row node at a second end of the first resistor ladder. One of K row conductors is coupled to each of the K row nodes. A second resistor ladder is comprised of J resistors connected in series with a column node between each resistor, yielding J-1 column nodes, and a second voltage reference connected to a first end of the second resistor ladder and a Jth column node at a second end of the second resistor ladder. One of J column conductors is coupled to each of the J column nodes. A third resistor ladder comprised of L resistors connected in series with a matrix node between each resistor, yielding L-1 matrix nodes, and a fourth voltage reference connected to a first end of the third resistor ladder and an Lth matrix node at a second end of the third resistor ladder. One of L matrix conductors is coupled to each of the L matrix nodes. A reference voltage conductor is coupled to a third reference voltage. A contact is supplied for each of the plurality of keys, such that when a key is depressed, electrical continuity is provided between the reference voltage conductor, one of the K row conductors, one of the J column conductors, and one of the L matrix conductors.

The alternative multiple key array further comprises a first scanning line coupled to a first row node, wherein the first row node is connected to a first row resistor of the K resistors, and wherein a first end of the first row resistor is the first end of the first resistor ladder and a second end of the first row resistor is connected to the first row node; a second scanning line coupled to a first column node, wherein the first column node is connected to a first column resistor of the J resistors, and wherein a first end of the first column resistor is first end of the second resistor ladder and a second end of the first column resistor is connected to the first column node; and a third scanning line coupled to a first matrix node, wherein the first matrix node is connected to a first matrix resistor of the L resistors, and wherein a first end of the first matrix resistor is the first end of the third resistor ladder and a second end of the first matrix resistor is connected to the first matrix node. In the preferred embodiment, the first reference voltage is the same as the second reference voltage and the fourth reference voltage, and the third reference voltage is at ground potential.

A method of reading an array of keys organized into a plurality of rows, columns, and matrices, comprises the steps of reading a first analog row voltage. A first row number is determined from the first analog row voltage. A first analog column voltage is read. A first column number is determined from the first analog column voltage;. A first analog matrix voltage is read. A first matrix number is determined from the first analog matrix voltage. After waiting for a first sample period to end, a second analog row voltage is read. A second row number is determined from the second analog row voltage. A second analog column voltage is read. A second column number is determined from the second analog column voltage. A second analog matrix voltage is read. A second matrix number is determined from the second analog matrix voltage. When the first row number and the second row number match, and the first column number and the second column number match, and the first matrix number and the second matrix number match, it is determined which key corresponds to the first row number, the first column number, and the first matrix number, and that key is processed as entered. When the first row number and the second row number do not match, or the first column number and the second column number do not match, or the first matrix number and the second matrix number do not match, the voltage readings are ignored.

Additionally, a key is recognized as released when the first analog row voltage, the first analog column voltage, the first analog matrix voltage, the second analog row voltage, the second analog column voltage, and the second analog matrix voltage are within a range of a reference voltage. The row voltages, column voltages, and matrix voltages may be looked up in a table stored in non-volatile memory.

A diagram of a plurality of keys and circuitry for scanning the keys (a key array) is shown in FIG. 1. A plurality of keys 101–116, in this case 16 keys are shown, are arranged in K rows and J columns, where K and J are integer numbers greater than one. In FIG. 1, K and J each equal four. The first column of keys includes four keys 101, 105, 109, and 113. The first row of keys includes four keys 101, 102, 103, and 104. Three conductors run under each of the keys 101–116, such that when a key is depressed, each of the conductors under the keys 101–116 is electrically shorted together. The three conductors include a reference conductor 133, one of K row conductors, and one of J column conductors, none of which are electrically connected unless a key is depressed.

The first conductor that runs under each key is a reference conductor 133. The reference conductor 133 is coupled to a voltage reference, $V_{REF3}$. In the preferred embodiment, $V_{REF3}$ is ground potential. The reference conductor 133 is shown in each of the keys as a small circle at the center of each key.

The second conductor that runs under each key is a column conductor. Four column conductors 121, 122, 123, and 124 are shown in FIG. 1. Only one of the four column conductors 121, 122, 123, and 124 runs under each of the keys 101–116. The first column conductor 121 runs under the four keys 101, 105, 109, and 113 in the first column of keys. The second column conductor 122 runs under the four keys 102, 106, 110, and 114 in the second column of keys. The third column conductor 123 runs under the four keys 103, 107, 111, and 115 in the third column of keys. The fourth column conductor 124 runs under the four keys 104, 108, 112, and 116 in the fourth column of keys.

The third conductor that runs under each key is a row conductor. Four row conductors 129, 130, 131, and 132 are shown in FIG. 1. Only one of the four row conductors 129, 130, 131, and 132 runs under each of the keys 101–116. The first row conductor 129 runs under the four keys 101, 102, 103, and 104 in the first row of keys. The second row conductor 130 runs under the four keys 105, 106, 107, and 108 in the second row of keys. The third row conductor 131 runs under the four keys 109, 110, 111, and 112 in the third row of keys. The fourth row conductor 132 runs under the four keys 113, 114, 115, and 116 in the fourth row of keys.

The scanning mechanism includes two resistor ladders, one to provide a voltage corresponding to the rows and one to provide a voltage corresponding to the columns. These resistor ladders are a series connection of K resistors for the rows and J resistors for the columns.

The first resistor ladder, for the columns, is comprised of J resistors, where J equals four resistors 117, 118, 119, and 120 in the preferred embodiment. Each of these resistors is connected in series, and there is a column node in between each resistor and at one end of the resistor ladder. One of the column conductors is connected to one of the column nodes and the one end of the resistor ladder. As shown in FIG. 1, the first column conductor 121 is connected to the column node between the first resistor 117 and the second resistor 118. The second column conductor 122 is connected to the column node between the second resistor 118 and the third resistor 119. The third column conductor 123 is connected to the column node between the third resistor 119 and the fourth resistor 120. The fourth column conductor 124 is connected to the far end of the first resistor ladder, which is the end of the fourth resistor 120 that is not connected to the third resistor 119. The other end of the first resistor ladder, which is the end of the first resistor 117 that is not connected to the second resistor 118, is attached to a first voltage reference, $V_{REF1}$. In the preferred embodiment, $V_{REF1}$ is 5.0 V.

The second resistor ladder, for the rows, is comprised of K resistors, where K equals four resistors 125, 126, 127, and 128 in the preferred embodiment. Each of these resistors is connected in series, and there is a row node in between each resistor and at one end of the resistor ladder. One of the row conductors is connected to one of the row nodes and the one end of the resistor ladder. As shown in FIG. 1, the first row conductor 129 is connected to the row node between the fifth resistor 125 and the sixth resistor 126. The second row conductor 130 is connected to the row node between the sixth resistor 126 and the seventh resistor 127. The third row conductor 131 is connected to the row node between the seventh resistor 127 and the eighth resistor 128. The fourth row conductor 132 is connected to the far end of the second resistor ladder, which is the end of the eighth resistor 128 that is not connected to the seventh resistor 127. The other end of the second resistor ladder, which is the end of the fifth resistor 125 that is not connected to the sixth resistor 126, is attached to a second voltage reference, $V_{REF2}$. In the preferred embodiment, $V_{REF2}$ is 5.0 V.

A column scan line 134 is connected to the first column node, which is connected to the first column conductor 121. The four resistors 117, 118, 119, and 120 in the first resistor ladder have values such that when any key in a different column is pressed, a different voltage appears at the column scan line 134, depending on what column that key appears in. The resistor values are chosen such that a unique voltage appears at the column scan line 134 for each different column of keys, in such a way that each voltage is easily distinguishable from a voltage of a different column. In the preferred embodiment, the first resistor 117 is a 51 kΩ resistor, the second resistor 118 is a 15 kΩ resistor, the third resistor 119 is a 27 kΩ resistor, and the fourth resistor 120 is a 62 kΩ resistor. Because of these chosen resistor values, when any key from the first column of keys is depressed, approximately zero volts appears at the column scan line 134. When any key from the second column of keys is depressed, approximately 1.1 volts appears at the column scan line 134. When any key from the third column of keys is pressed, a voltage of approximately 2.3 volts appears at the column scan line 134. When any key from the fourth column of keys is depressed, a voltage of approximately 3.4 volts appears at the column scan line 134. When no keys are pressed, approximately five volts appears at the column scan line 134. Thus, a different voltage appears on the column scan line 134 when a key from a different column is depressed.

A similar approach is used for the rows, where a different voltage appears for each different row of keys at the row scan line 135. A row scan line 135 is connected to the first row node, which is connected to the first row conductor 129. The four resistors 125, 126, 127, and 128 in the second resistor ladder have values such that when any key in a different row is pressed, a different voltage appears at the row scan line 135, depending on what row that key appears in. The resistor values are chosen such that a unique voltage appears at the row scan line 135 for each different row of keys, in such a way that each voltage is easily distinguishable from a voltage of a different row. In the preferred embodiment, the fifth resistor 125 is a 51 kΩ resistor, the sixth resistor 126 is a 15 kΩ resistor, the seventh resistor 127 is a 27 kΩ resistor, and the eighth resistor 128 is a 62 kΩ resistor. Because of these chosen resistor values, when any key from the first row of keys is depressed, approximately zero volts appears at the row scan line 135. When any key from the second row of keys is depressed, approximately 1.1 volts appears at the row scan line 135. When any key from the third row of keys is pressed, a voltage of approximately 2.3 volts appears at the row scan line 135. When any key from the fourth row of keys is depressed, a voltage of approximately 3.4 volts appears at the row scan line 135. When no keys are pressed, approximately five volts appears at the row scan line 135. Thus, a different voltage appears on the row scan line 135 when a key from a different row is depressed.

When a key is depressed, all three conductors under that key are shorted together, thereby producing a different combination of voltages at the column scan line and the row scan line for each key. Because each key has a unique column/row voltage pair associated with it, determining which key has been pressed is as easy as looking up each pair in a table. Such a table appears at the end of this section. In the preferred embodiment, a key is any conventional key that when depressed, is capable of shorting together each of the three conductors that run under the key, and when released, shorts together none of the three conductors that run under the key. A contact is connected to each key, such that when a key is depressed, electrical continuity (also known as an electrical short or simply a short) is provided between the reference voltage conductor, one of the K row conductors, and one of the J column conductors.

In the preferred embodiment, the column scan line 134 is connected to a first analog input on a processor 136, such as a 68HC11 microprocessor available from Motorola, Inc., such that the processor 136 can read the voltage value on the column scan line 134. The row scan line 135 is connected to a second analog input on the processor 136, such that the processor 136 can read the voltage value on the row scan line 135. The processor 136 has a non-volatile memory source 137, which in the preferred embodiment is an EEPROM (electrically erasable programmable read only memory). The non-volatile memory source 137 has stored in it a table in which acceptable ranges for each different row and column voltage are entered. When a voltage is measured within that range, that row or column is deemed to have been selected by a key depression. When a valid row-column pair is read by the processor 136, the key corresponding to that row-column pair is deemed to have been pressed, and the processor then processes that key.

Figure 2:
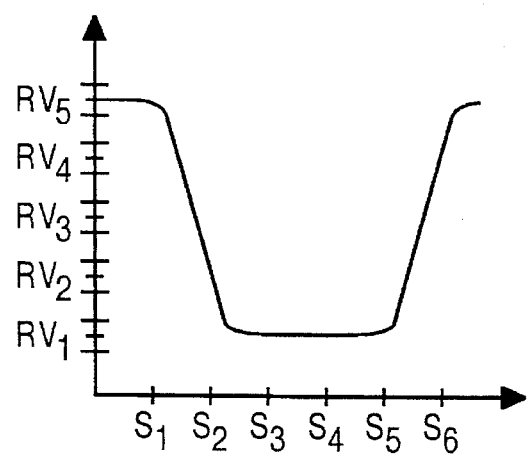
FIG. 2 is a voltage versus timing graph of a key depression in accordance with the invention.

As shown in FIG. 2, voltage range 5 ($VR_5$), which is nominally at 5-volts in the preferred embodiment, is originally the range in which the scan line reads the voltage. As a key is depressed in the first row or column, the voltage decreases through voltage range 4 ($VR_4$), voltage range 3 ($VR_3$), and voltage range 2 ($VR_2$) to voltage range 1 ($VR_1$). The key stays at that voltage level for as long as the key is pressed, approximately three sample periods in FIG. 2. After the key is released, the voltage returns to the fifth voltage range, which shows no key is being depressed. The processor samples the two analog input lines for the scan values at known sample times, which tend to be about 17 msec apart in the preferred embodiment. FIG. 2 shows six sample periods, and at the fourth sample period $S_4$, in the preferred embodiment, the key press is determined to have occurred. See FIG. 4 for further description.

Figure 3:
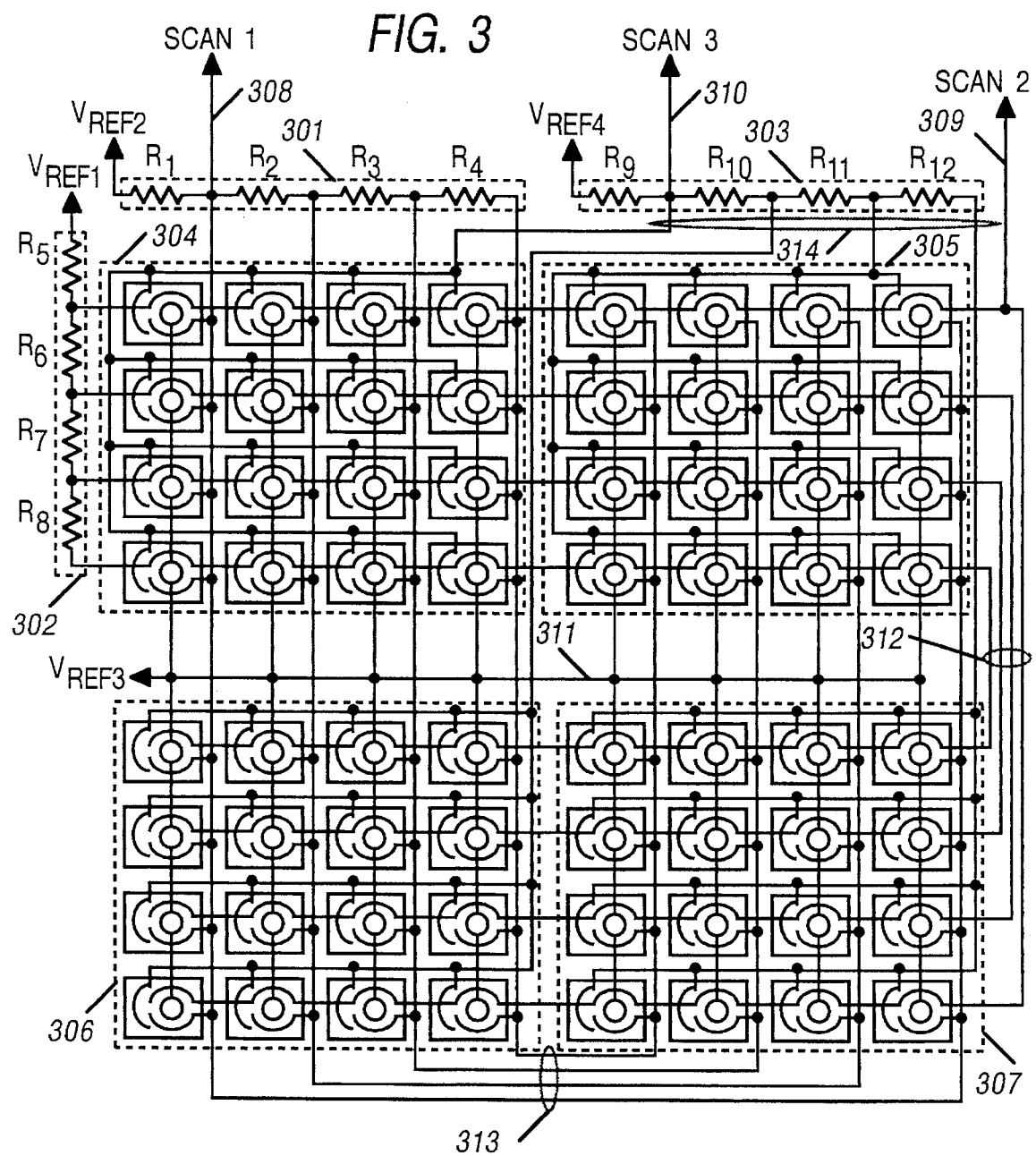
FIG. 3 is a diagram of an 8×8 key array in accordance with the invention.

A diagram showing an extension of the present invention to additional keys in the form of an 8×8 key array is shown in FIG. 3. A plurality of keys are organized into K rows, J columns, and L matrices, where K, J, and L are integer numbers greater than one. This embodiment entails three resistor ladders 301, 302, and 303, each of which comprise four resistors. Any number of resistors may be applied in each resistor ladder as long as the scanning mechanism that reads the scanned voltages is able to distinguish between the different voltages that appear at a scan line. In FIG. 3, 64 keys are broken into four groups of keys, or four matrices 304, 305, 306, and 307, i.e., L equals four, where each of the four matrices contains 16 keys broken into K rows and J columns, where K equals four and J equals four. The number of keys may be extended beyond 64, as long as the resulting voltage ranges are able to be distinguished by the voltage reader. For example, if each of the four matrices of keys contain 25 keys for a total of 100 keys, the first resistor ladder would contain five resistors, the second resistor ladder would contain five resistors, and the third resistor ladder would contain four resistors. One of average skill in the art would recognize that if the third resistor ladder were extended to a fifth resistor, such as the first and second resistor ladders in this example, 125 keys in five matrices of 25 keys would be readable by this particular apparatus.

The embodiment of FIG. 3 is the same for the first resistor ladder 301 and the second resistor ladder 302 as described above for FIG. 1, except that the row conductors 312 and column conductors 313 are extended to each of the 64 keys as shown. The third resistor ladder 303 is constructed in a similar way as the first resistor ladder 301 and the second resistor ladder 302, as was described for FIG. 1.

In FIG. 3, a different voltage appears for each different matrix of keys at the matrix scan line 310. A matrix scan line 310 is connected to the first matrix node, which is connected to the first matrix conductor of four matrix conductors 314. The L resistors, four in the preferred embodiment, in the third resistor ladder have values such that when any key in a different matrix is pressed, a different voltage appears at the matrix scan line 310, depending on what matrix that key appears in. The resistor values are chosen such that a unique voltage appears at the matrix scan line 310 for each different matrix of keys, in such a way that each voltage is easily distinguishable from a voltage of a different matrix. In the preferred embodiment, the ninth resistor $R_9$ is a 51 kΩ resistor, the tenth resistor $R_{10}$ is a 15 kΩ resistor, the eleventh resistor $R_{11}$ is a 27 kΩ resistor, and the twelfth resistor $R_{12}$ is a 62 kΩ resistor. Because of these chosen resistor values, when any key from the first matrix 304 of keys is depressed, approximately zero volts appears at the matrix scan line 310. When any key from the second matrix of keys 306 is depressed, approximately 1.1 volts appears at the matrix scan line 310. When any key from the third matrix 305 of keys is pressed, a voltage of approximately 2.3 volts appears at the matrix scan line 310. When any key from the fourth matrix 307 of keys is depressed, a voltage of approximately 3.4 volts appears at the matrix scan line 310. When no keys are pressed, approximately five volts appears at the matrix scan line 310. Thus, a different voltage appears on the matrix scan line 310 when a key from a different matrix is depressed.

When a key is depressed in the embodiment of FIG. 3, all four conductors under that key are shorted together, thereby producing a different combination of voltages at the column scan line, the row scan line, and the matrix scan line for each key. Because each key has a unique column/row/matrix voltage set associated with it, determining which key has been pressed is as easy as looking up each pair in a table. In the preferred embodiment, a key is any conventional key that when depressed, is capable of shorting together each of the four conductors that run under the key, and when released, shorts together none of the four conductors that run under the key.

The key arrangement apparatus of FIG. 3 includes three scan lines, 308, 309, and 310. The first scan line 308 reads the column, the second scan line 309 reads the row, and the third scan line 310 reads the matrix (one of the first group of keys 304, the second group of keys 306, the third group of keys 305, or the fourth group of keys 307). As in FIG. 1, there are four column conductors 313, and one of the four column conductors 313 runs under each key. Four row conductors 312 are also shown, as shown in FIG. 1, and one of the four row conductors 3 12 runs under each of the keys. A reference conductor 311 is also runs under each of the keys. There are also four matrix conductors 314. One of the four matrix conductors 314 runs under each key as well. With this arrangement, when a single key is depressed, a unique row voltage, column voltage, and matrix voltage appear at the three scan lines 308, 309, and 310. In this way, the present invention is extended to operate on 64 keys, without requiring exceptionally sensitive voltage readers, while only utilizing three input/output lines of a processor 136 or other such reading or scanning device.

Figure 4:
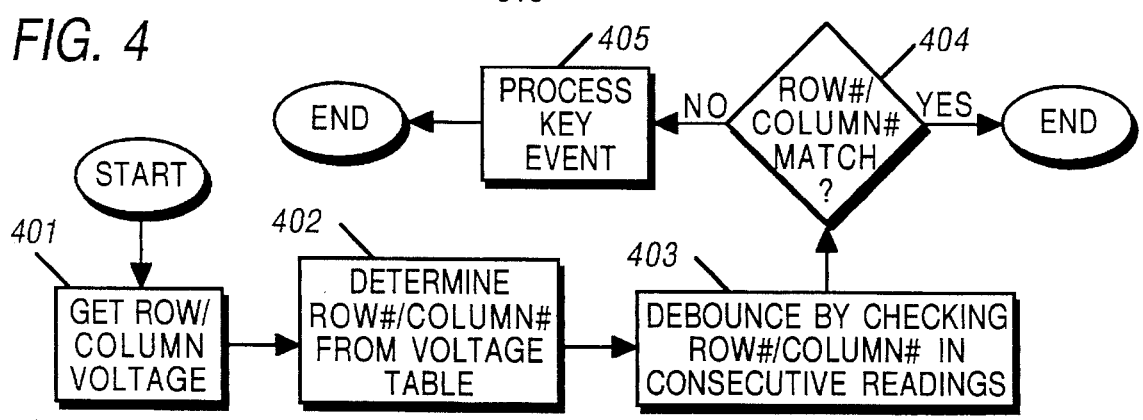
FIG. 4 is a flowchart showing a method of scanning a key array in accordance with the invention.

A flowchart showing a method of scanning a key array is shown in FIG. 4. The flowchart of FIG. 4 is performed by the processor 136 of FIG. 1 in the preferred embodiment. A row and column voltage are obtained in step 401. At step 402, the appropriate row number and column number are determined from the voltage range table as shown below. This determining step is performed by looking up a row voltage and a column voltage in a table stored in non-volatile memory, such as the EEPROM 137 in FIG. 1. For example, if the row voltage is 2.25 V and the column voltage is 0.10 V, the row number is 2 and the column number is 1. At step 403, the keystroke is debounced by checking again the row number and column number by taking consecutive readings of the scan lines. If the two readings, one from step 402 and one from step 403 match, i.e., the row number and column number are the same, at step 404 that a particular key is considered depressed, and the key event is processed. Furthering the above example, if the second row voltage is 2.20 V and the second column voltage is 0.15 V, the row number is 2 and the column number is 1, and as such, the microprocessor will process this row#/column# relates as a depression of the "4" key. Thus, a range of values can represent a key depression. Further, more than two readings may be taken to insure accuracy.

The flowchart of FIG. 4 is easily extendible to reading the key array of FIG. 3. Again the flowchart of FIG. 4 is performed by the processor 136 of FIG. 1 in the preferred embodiment. A row, column, and matrix voltage are obtained in step 401. At step 402, the appropriate row number, column number, and matrix number are determined from a voltage range table. This determining step is performed by looking up a row voltage, a column voltage, and a matrix voltage in a table stored in non-volatile memory, such as the EEPROM 137 in FIG. 1. Although no row/column/matrix voltage table is shown for the key array of FIG. 3, one of skill in the art can easily extrapolate the data necessary from the table shown below. At step 403, the keystroke is debounced by checking again the row number, column number, and matrix number by taking consecutive readings of the scan lines. If the two readings, one from step 402 and one from step 403 match, i.e., the row number, column number, and matrix number are the same, at step 404 that a particular key is considered depressed, and the key event is processed.

By allowing a range of values to represent a key depression, and by taking consecutive readings of each scan line, a more accurate key reading can be obtained even when a voltage reference has a temporary change due to loading conditions elsewhere in a device for a voltage source that provides the voltage reference. If the key array is installed in a communication unit, such as a portable or mobile radio, the voltage references within the communication unit are prone to transient voltages, i.e., quick variations in voltage, due to the heavy current drain on any voltage source in the communication unit when it transmits or performs other current draining activities. By checking the voltage twice, and using an appropriate voltage range for each row, column, and/or matrix, the scanning of the key array is less inclined to produce to error in reading a key. Hence, the combination of the above apparatus and method provides a robust mechanism for scanning a key array in a communication unit.

The present invention reduces the number of components required to achieve a key array scan. This reduction includes the number of resistors as well as input/output ports to a microprocessor, the addition of extra devices like peripheral interface adapters, multiplexers, demultiplexers, or a separate key array processor. Most key array scanning circuits require at least K+J processor ports. Because the key array scanning circuit contains so few elements and only uses two analog input ports on a single chip processor, the key array and/or related circuit can be realized in a very small space. Such a small space includes a low-cost flex circuit, which helps reduce the overall size and cost of a device, such as a two-way radio or similar device, that utilizes such a key array, especially if the key array is considered an add-on option.

What is claimed is:

1. An apparatus comprising:

a plurality of keys organized into K rows and J columns, where K and J are integer numbers greater than one;

a first resistor ladder comprised of K resistors connected in series with a row node between each resistor, yielding K-1 row nodes, and a first voltage reference connected to a first end of the first resistor ladder and a Kth row node at a second end of the first resistor ladder;

K row conductors, wherein each of the K row nodes is coupled to one of the K row conductors;

a second resistor ladder comprised of J resistors connected in series with a column node between each resistor, yielding J-1 column nodes, and a second voltage reference connected to a first end of the second resistor ladder and a Jth column node at a second end of the second resistor ladder;

J column conductors, wherein each of the J column nodes is coupled to one of the J column conductors;

a reference voltage conductor coupled to a third reference voltage;

a contact for each of the plurality of keys, such that when a key is depressed, electrical continuity is provided between the reference voltage conductor, one of the K row conductors, and one of the J column conductors.

2. The apparatus of claim 1, further comprising:

a first scanning line coupled to a first row node, wherein the first row node is connected to a first row resistor of the K resistors, and wherein a first end of the first row resistor is the first end of the first resistor ladder and a second end of the first row resistor is connected to the first row node;

a second scanning line coupled to a first column node, wherein the first column node is connected to a first column resistor of the J resistors, and wherein a first end of the first column resistor is the first end of the second resistor ladder and a second end of the first column resistor is connected to the first column node.

3. The apparatus of claim 2, further comprising a processor having a first analog processor input and a second analog processor input, wherein the first scanning line is coupled to the first analog processor input and the second scanning line is coupled to the second analog processor input, such that the

| Key Name | Row Number | Column Number | Nominal Row Voltage (Volts) | Row Voltage Range (Volts) | Nominal Column Voltage (Volts) | Column Voltage Range (Volts) |
|---|---|---|---|---|---|---|
| not used | 1 | 4 | 3.35 | 3.24–3.46 | 3.35 | 3.24–3.46 |
| MON | 2 | 4 | 2.26 | 2.13–2.38 | 3.35 | 3.24–3.46 |
| MEM | 3 | 4 | 1.14 | 1.05–1.23 | 3.35 | 3.24–3.46 |
| OPT | 4 | 4 | 0.00 | 0.00–0.35 | 3.35 | 3.24–3.46 |
| 1 | 1 | 1 | 3.35 | 3.24–3.46 | 0.00 | 0.00–0.35 |
| 2 | 1 | 2 | 3.35 | 3.24–3.46 | 1.14 | 1.05–1.23 |
| 3 | 1 | 3 | 3.35 | 3.24–3.46 | 2.26 | 2.13–2.38 |
| 4 | 2 | 1 | 2.26 | 2.13–2.38 | 0.00 | 0.00–0.35 |
| 5 | 2 | 2 | 2.26 | 2.13–2.38 | 1.14 | 1.05–1.23 |
| 6 | 2 | 3 | 2.26 | 2.13–2.38 | 2.26 | 2.13–2.38 |
| 7 | 3 | 1 | 1.14 | 1.05–1.23 | 0.00 | 0.00–0.35 |
| 8 | 3 | 2 | 1.14 | 1.05–1.23 | 1.14 | 1.05–1.23 |
| 9 | 3 | 3 | 1.14 | 1.05–1.23 | 2.26 | 2.13–2.38 |
| * | 4 | 1 | 0.00 | 0.00–0.35 | 0.00 | 0.00–0.35 |
| 0 | 4 | 2 | 0.00 | 0.00–0.35 | 1.14 | 1.05–1.23 |
| # | 4 | 3 | 0.00 | 0.00–0.35 | 2.26 | 2.13–2.38 |
| Key Release | n/a | n/a | 5.00 | 4.75–5.00 | 5.00 | 4.75–5.00 | processor detects a first voltage on the first scanning line and a second voltage on the second scanning line, and wherein the first voltage and the second voltage correspond to one of the plurality of keys being depressed.

4. The apparatus of claim 1, wherein the first reference voltage is the same as the second reference voltage.

5. The apparatus of claim 1, wherein the third reference voltage is at ground potential.

6. The apparatus of claim 1, wherein the first reference voltage is 5.0 V.

7. The apparatus of claim 1, wherein the first resistor ladder and the second resistor ladder are each comprised of a 51 k$\Omega$ resistor, a 15 k$\Omega$ resistor, a 27 k$\Omega$ resistor, and a 62 k$\Omega$ resistor.

8. An apparatus comprising:

a plurality of keys organized into L matrices, wherein each of the L matrices is organized into K rows and J columns, where K, J, and L are integer numbers greater than one;

a first resistor ladder comprised of K resistors connected in series with a row node between each resistor, yielding K-1 row nodes, and a first voltage reference connected to a first end of the first resistor ladder and a Kth row node at a second end of the first resistor ladder;

K row conductors, wherein each of the K row nodes is coupled to one of the K row conductors;

a second resistor ladder comprised of J resistors connected in series with a column node between each resistor, yielding J-1 column nodes, and a second voltage reference connected to a first end of the second resistor ladder and a Jth column node at a second end of the second resistor ladder;

J column conductors, wherein each of the J column nodes is coupled to one of the J column conductors;

a third resistor ladder comprised of L resistors connected in series with a matrix node between each resistor, yielding L-1 matrix nodes, and a fourth voltage reference connected to a first end of the third resistor ladder and an Lth matrix node at a second end of the third resistor ladder;

L matrix conductors, wherein each of the L matrix nodes is coupled to one of the L matrix conductors;

a reference voltage conductor coupled to a third reference voltage;

a contact for each of the plurality of keys, such that when a key is depressed, electrical continuity is provided between the reference voltage conductor, one of the K row conductors, one of the J column conductors, and one of the L matrix conductors.

9. The apparatus of claim 8, further comprising:

a first scanning line coupled to a first row node, wherein the first row node is connected to a first row resistor of the K resistors, and wherein a first end of the first row resistor is the first end of the first resistor ladder and a second end of the first row resistor is connected to the first row node;

a second scanning line coupled to a first column node, wherein the first column node is connected to a first column resistor of the J resistors, and wherein a first end of the first column resistor is the first end of the second resistor ladder and a second end of the first column resistor is connected to the first column node; and a third scanning line coupled to a first matrix node, wherein the first matrix node is connected to a first matrix resistor of the L resistors, and wherein a first end of the first matrix resistor is the first end of the third resistor ladder and a second end of the first matrix resistor is connected to the first matrix node.

10. The apparatus of claim 8, wherein the first reference voltage is the same as the second reference voltage and the fourth reference voltage.

11. The apparatus of claim 8, wherein the third reference voltage is at ground potential.

12. The apparatus of claim 8, wherein the first reference voltage is 5.0 V.

13. The apparatus of claim 8, wherein the first resistor ladder, the second resistor ladder, and the third resistor ladder are each comprised of a 51 k$\Omega$ resistor, a 15 k$\Omega$ resistor, a 27 k$\Omega$ resistor, and a 62 k$\Omega$ resistor.

14. An apparatus comprising:

a plurality of keys organized into K rows and J columns, where K and J are integer numbers greater than one;

a first resistor ladder comprised of K resistors connected in series with a row node between each resistor, yielding K-1 row nodes, and a first voltage reference connected to a first end of the first resistor ladder and a Kth row node at a second end of the first resistor ladder;

K row conductors, wherein each of the K row nodes is coupled to one of the K row conductors;

a second resistor ladder comprised of J resistors connected in series with a column node between each resistor, yielding J-1 column nodes, and a second voltage reference connected to a first end of the second resistor ladder and a Jth column node at a second end of the second resistor ladder;

J column conductors, wherein each of the J column nodes is coupled to one of the J column conductors;

a reference voltage conductor coupled to a third reference voltage;

a contact for each of the plurality of keys, such that when a key is depressed, electrical continuity is provided between the reference voltage conductor, one of the K row conductors, and one of the J column conductors;

a first scanning line coupled to a first row node, wherein the first row node is connected to a first row resistor of the K resistors, and wherein a first end of the first row resistor is the first end of the first resistor ladder and a second end of the first row resistor is connected to the first row node; and a second scanning line coupled to a first column node, wherein the first column node is connected to a first column resistor of the J resistors, and wherein a first end of the first column resistor is the first end of the second resistor ladder and a second end of the first column resistor is connected to the first column node;

a processor having a first analog processor input and a second analog processor input, wherein the first scanning line is coupled to the first analog processor input and the second scanning line is coupled to the second analog processor input.

15. The apparatus of claim 14, further comprising:

a memory having stored within a row voltage and a column voltage for each of the plurality of keys;

wherein the processor detects a first voltage on the first scanning line and a second voltage on the second scanning line; and wherein the first voltage and the second voltage correspond to the row voltage and the column voltage when one of the plurality of keys is depressed.

16. The apparatus of claim 14, wherein the first reference voltage is the same as the second reference voltage.

17. The apparatus of claim 14, wherein the third reference voltage is at ground potential.

18. The apparatus of claim 14, wherein the first resistor ladder the second resistor ladder are each comprised of a 51 kΩ resistor, a 15 kΩ resistor, a 27 kΩ resistor, and a 62 kΩ resistor, and wherein the first reference voltage is 5.0 V.

19. The apparatus of claim 14, wherein resistor values for the first resistor ladder provide a unique voltage at the first scanning line for each different row of keys, in such a way that each voltage is easily distinguishable from a voltage of a different row.

20. The apparatus of claim 14, wherein resistor values for the second resistor ladder provide a unique voltage at the second scanning line for each different column of keys, in such a way that each voltage is easily distinguishable from a voltage of a different column.

* * * * *